(12) United States Patent
Yang

(10) Patent No.: US 10,075,178 B1
(45) Date of Patent: Sep. 11, 2018

(54) DIGITAL-TO-ANALOG CONVERTER AND AN OPERATION METHOD THEREOF

(71) Applicant: REALTEK SEMICONDUCTOR CORP., Hsinchu (TW)

(72) Inventor: Chih-Chieh Yang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/835,047

(22) Filed: Dec. 7, 2017

(30) Foreign Application Priority Data

Apr. 24, 2017 (TW) .............................. 106113623 A

(51) Int. Cl.
H03M 1/66 (2006.01)
H03M 1/68 (2006.01)
H03M 1/10 (2006.01)

(52) U.S. Cl.
CPC ........... *H03M 1/68* (2013.01); *H03M 1/1028* (2013.01)

(58) Field of Classification Search
CPC ............................... H03M 1/68; H03M 1/1028
USPC ........................................................ 341/144
See application file for complete search history.

(56) References Cited

U.S. PATENT DOCUMENTS

| 7,076,384 B1 * | 7/2006 | Radulov | H03M 1/1057 324/601 |
| 9,065,480 B1 | 6/2015 | Tseng | |
| 2005/0212489 A1 * | 9/2005 | Denning | H02J 7/0031 320/134 |
| 2012/0188461 A1 * | 7/2012 | Katsis | H03M 1/002 348/720 |
| 2014/0266824 A1 * | 9/2014 | Lowney | H03M 1/1009 341/120 |
| 2016/0134302 A1 * | 5/2016 | Schafferer | H03M 1/066 341/120 |

OTHER PUBLICATIONS

Yonghua Cong, et al., "A 1.5-V 14-Bit 100-MS/s Self-Calibrated DAC", IEEE Journal of Solid-State Circuits, vol. 38,Issue: 12, Dec. 2003.

(Continued)

*Primary Examiner* — Lam T Mai
(74) *Attorney, Agent, or Firm* — Li & Cai Intellectual Property (USA) Office

(57) ABSTRACT

A digital-to-analog converter (DAC) includes a DAC circuit, a switch circuit and a control circuit. The DAC circuit includes most significant bit digital-to-analog converter (MDAC) circuits and calibration digital-to-analog converter (CDAC) circuits. The switch circuit includes a current source circuit and a detection circuit. The MDAC, CDAC circuits and the current source circuit are coupled to a first output terminal and a second output terminal of the DAC circuit. In a calibration mode, the current source circuit generates current deviation of the first output terminal and the second output terminal. The detection circuit detects the current differences to generate detection signals. The control circuit outputs control signals to the CDAC circuits to adjust output currents of the CDACs at the first output terminal and the second output terminal. In a regular mode, the current source circuit is configured to function as a dual DC current source.

17 Claims, 4 Drawing Sheets

(56) References Cited

OTHER PUBLICATIONS

Yusuke Ikeda, et al., "A 14-bit 100-MS/s Digitally Calibrated Binary-Weighted Current-Steering CMOS DAC without calibration ADC", IEEE Asian Solid-State Circuits Conference, Nov. 12-14, 2007.
Wei-Hsin Tseng, et al., "A 960MSs DAC with 80dB SFDR in 20nm CMOS for Multi-Mode Baseband Wireless Transmitter", 2014 Symposium on VLSI Circuits Digest of Technical Papers.
Meng-Hung Shen, et al., "A Low Cost Calibrated DAC for High-Resolution Video Display System", IEEE Transactions on Very Large Scale Integration (VLSI) Systems, vol. 20, No. 9, Sep. 2012.

\* cited by examiner

DIGITAL-TO-ANALOG CONVERTER AND AN OPERATION METHOD THEREOF

BACKGROUND OF THE INVENTION

1. Field of the Invention

The present disclosure relates to a digital-to-analog converter, and, more particularly, to a digital-to-analog converter and an operation method thereof.

2. Description of Related Art

Digital-to-analog converters can be found in most electronic devices, and are particularly important in the field of wireless communication. However, current mismatch has always been a problem in digital-to-analog converters, which results in a direct impact on the accuracy of digital-to-analog converters. In order to overcome the issue of current mismatch, multiple calibration techniques and calibration circuits are developed accordingly.

SUMMARY OF THE INVENTION

A digital-to-analog converter having a first output terminal and a second output terminal is provided in the present disclosure. The digital-to-analog converter (DAC) includes a DAC circuit, a switch circuit and a control circuit. The DAC circuit includes multiple most significant bit digital-to-analog converter (MDAC) circuits and multiple calibration digital-to-analog converter (CDAC) circuits. The switch circuit includes a current source circuit and a detection circuit. The MDAC circuits, the CDAC circuits and the current source circuit are coupled to the first output terminal and the second output terminal. The current source circuit is configured to serve as a current mirror in a calibration mode to generate a current deviation of the first output terminal and the second output terminal. The detection circuit is configured to detect the current deviation to generate a detection signal, in which the detection circuit corresponds to one of the MDAC circuits. The control circuit is configured to output a control signal to the CDAC circuits according to the detection signal for adjusting output currents at the first output terminal and the second output terminal outputted by the CDAC circuits. The current source circuit is configured to serve as a dual DC current source in the regular mode.

An operation method applied to a DAC is provided in the present disclosure. The DAC includes a DAC circuit having a first output terminal and a second output terminal. The DAC circuit includes multiple MDAC circuits and multiple CDAC circuits. The operation method includes: entering into a calibration mode; calibrating each of the MDAC circuits to obtain a first control signal corresponding to each of the MDAC circuits, in which the first control signal controls the CDAC circuits; generating a second control signal according to the first control signal corresponding to each of the MDAC circuits; generating a bias voltage to multiple MDAC circuits according to the second control signal; and calibrating each of the MDAC circuits receiving the bias voltage to obtain a third control corresponding to each of the MDAC circuits, in which the third control signal controls the CDAC circuits.

In some embodiments, the operation method further includes: entering into a regular mode; receiving a digital input signal; and converting the digital input signal into an analog output signal according to the bias voltage and the third control signal corresponding to each of the MDAC circuits.

In order to further the understanding of the present disclosure, the following embodiments are provided along with illustrations to facilitate the disclosure of the present disclosure.

DETAILED DESCRIPTION OF THE PREFERRED EMBODIMENTS

The aforementioned illustrations and following detailed description are exemplary for the purpose of further explaining the scope of the present disclosure. Other objectives and advantages related to the present disclosure are illustrated in the following description and appended drawings.

Figure 1:
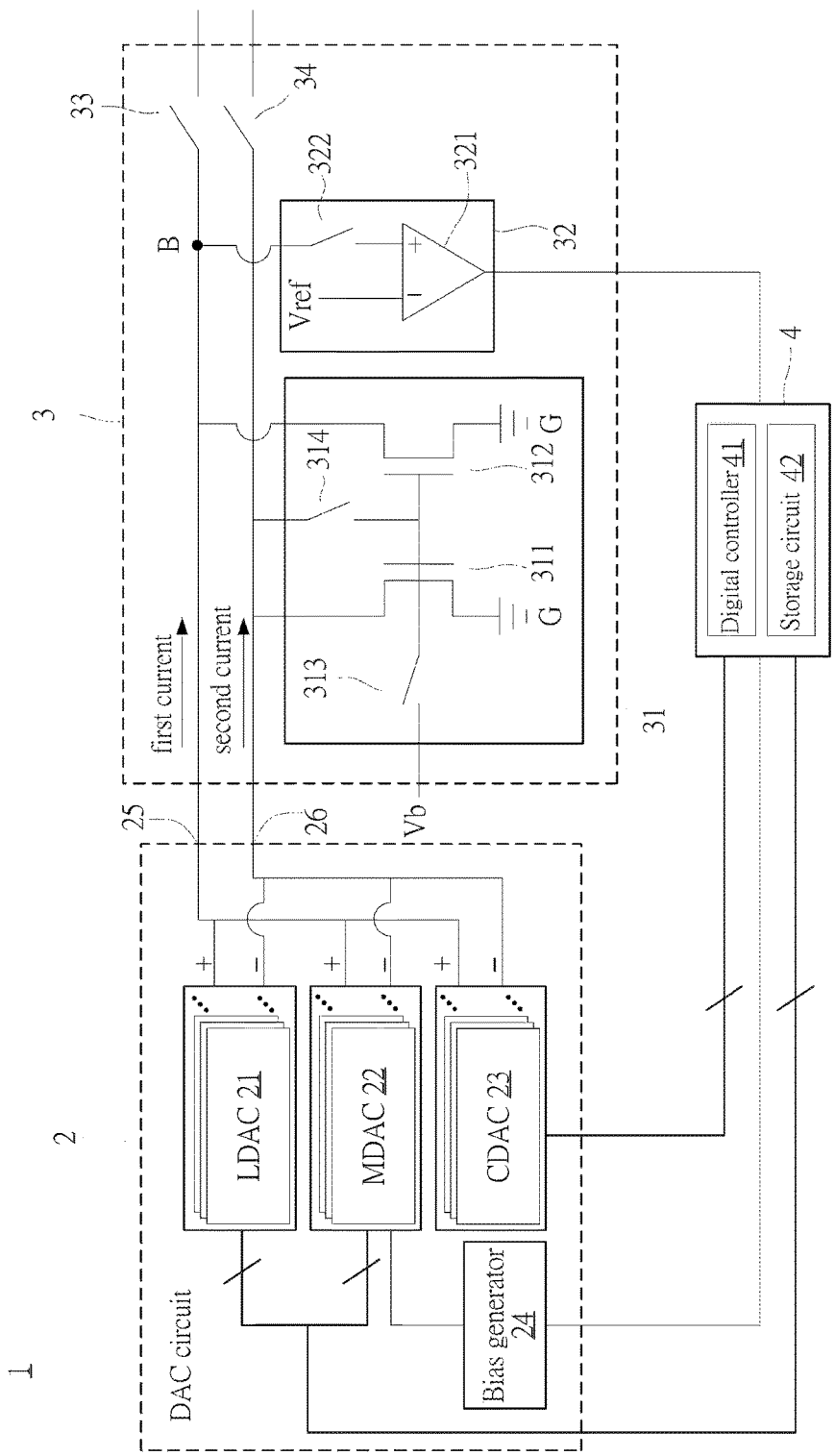
FIG. 1 is a schematic diagram illustrating a digital-to-analog converter (DAC) according to an embodiment of the present disclosure.

Reference is made to FIG. 1, which is a schematic diagram illustrating a digital-to-analog converter (DAC) according to an embodiment of the present disclosure. The DAC 1 includes a DAC circuit 2, a switch circuit 3 and a control circuit 4. The switch circuit 3 is coupled to the DAC circuit 2, and the control circuit 4 is coupled to the DAC circuit 2 and the switch circuit 3.

The DAC circuit 2 is configured to convert a digital input signal into an analog output signal. The DAC circuit 2 includes a plurality of least significant bit digital-to-analog converter circuits 21 (LDAC), a plurality of most significant bit digital-to-analog converter circuits 22 (MDAC), a plurality of calibration DAC circuits 23 (CDAC) and a bias generator 24. The plurality of MDACs 22, LDACs 21 and CDACs 23 are coupled to an output terminal 25 and an output terminal 26. The bias generator 24 is coupled to the plurality of MDACs 22, and the output terminal 25 and the output terminal 26 respectively output a first current and a second current. In some embodiments, the plurality of MDACs 22 respectively correspond to different most significant bits $MSB_0 \sim MSB_x$, and the plurality of LDACs 21 respectively correspond to different least significant bits $LSB_0 \sim LSB_y$. The numbers x+1 and y+1 represent the number of MDAC 22 and LDAC 21, respectively.

Figure 2A:
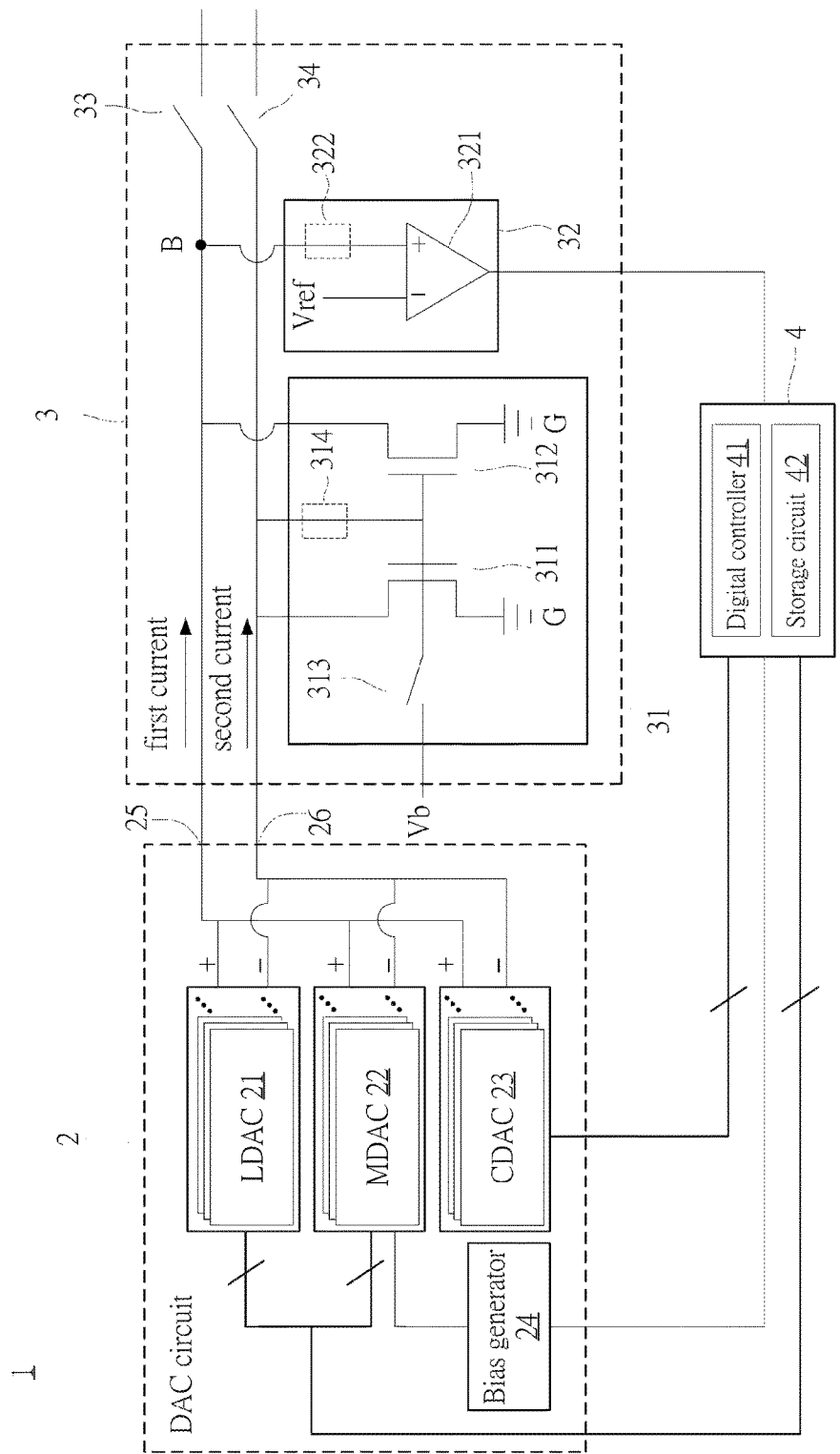
FIG. 2A is a schematic diagram illustrating a DAC operating in a calibration mode according to an embodiment of the present disclosure.
Figure 2B:
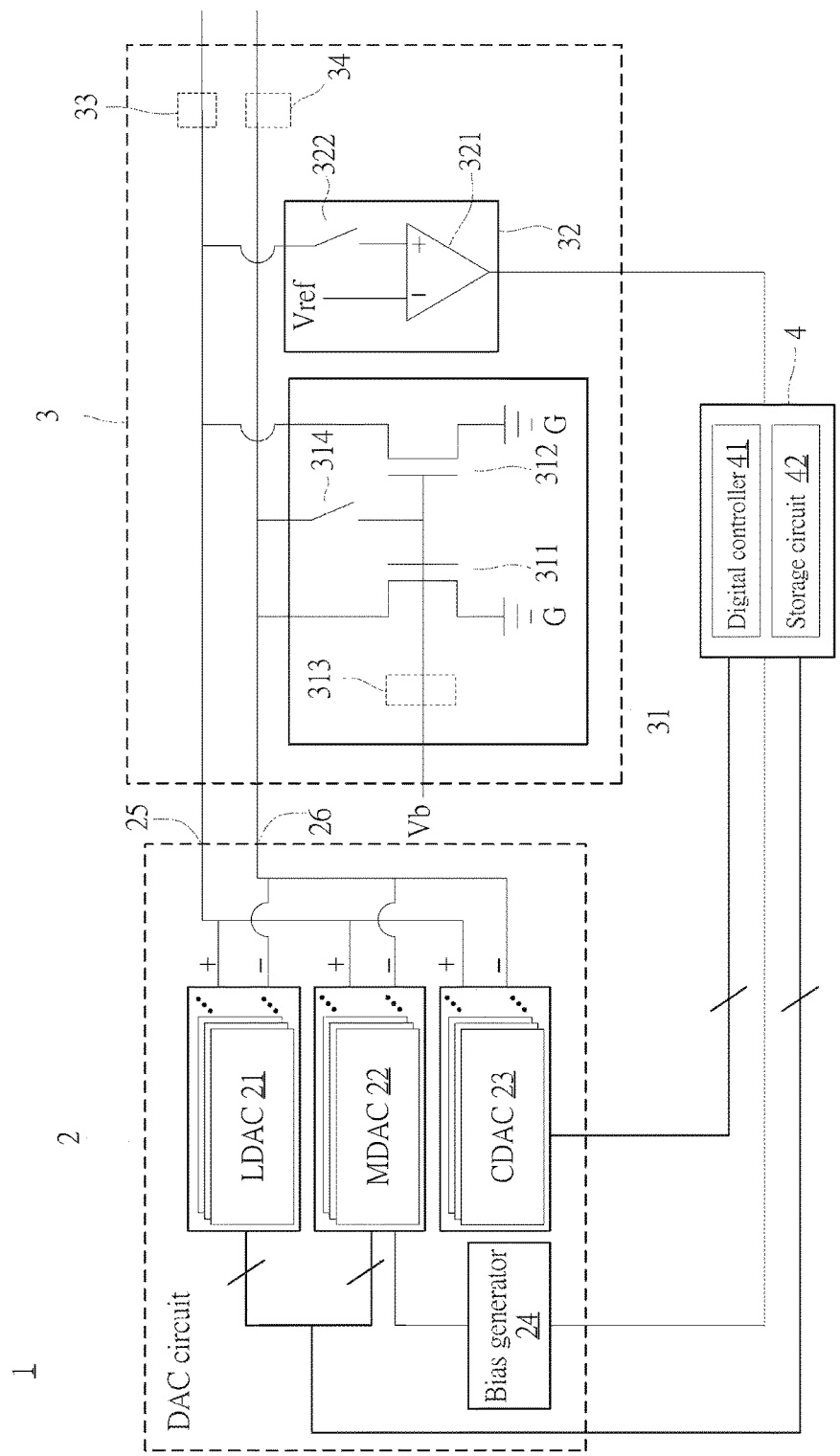
FIG. 2B is a schematic diagram illustrating a DAC operating in a regular mode according to an embodiment of the present disclosure.

The switch circuit 3 is configured to detect, in a calibration mode, a current deviation of the output terminal 25 and the output terminal 26 (i.e., the difference between the first current and the second current), and is configured to provide a dual DC current source in a regular mode (as shown in FIGS. 2A and 2B). The switch circuit 3 includes a current source circuit 31, a detection circuit 32, a switch 33 and a switch 34. The current source circuit 31 is coupled to the output terminal 25 and the output terminal 26, and is configured to serve as a current mirror in the calibration mode to generate the current deviation of the output terminal 25 and the output terminal 26. The current source circuit 31 serves as a dual DC current source in the regular mode. The current source circuit 31 includes a transistor 311, a transistor 312, a switch 313 and a switch 314. The transistor 311 has a first end coupled to the output terminal 26, a second end coupled to a ground terminal G, and a control end coupled to the switch 314. The transistor 312 has a first end coupled to the output terminal 25, a second end coupled to the ground G, and a control end coupled to the control end of the transistor 311. On the other hand, the switch 313 is coupled between the control end of the transistor 311 and a voltage end Vb, and the switch 314 is coupled between the output terminal 26 and the control end of the transistor 311.

The detection circuit 32 is configured to detect, in the calibration mode, whether a current deviation (i.e., the difference between the first current and the second current) of the output terminal 25 and the output terminal 26 occurs, and then to generate a detection signal. The detection circuit 32 includes a comparison circuit 321 and a switch 322. The comparison circuit 321 has a first input terminal, a second input terminal and an output terminal. The first input terminal is coupled to the switch 322, the second input terminal is coupled to a reference voltage Vref, and the output terminal is coupled to the control circuit 4. The switch 322 is coupled between the output terminal 25 and the first input terminal of the comparison circuit 321.

In some embodiments, if the current deviation of the output terminal 25 and the output terminal 26 is smaller than a threshold value, it can be seen as no current deviation occurs between the output terminal 25 and the output terminal 26 of the detection circuit 32.

The switch 33 is coupled between the output terminal 25 and one of the output terminals of the DAC 1, the switch 34 is coupled between the output terminal 26 and the other output terminal of the DAC 1. It should be noted that the switches 313, 314, 322, 33 and 34 are configured to switch the DAC 1 between operating in the calibration mode and the regular mode.

Reference is made to both FIG. 1 and FIG. 2A, where FIG. 2A is a schematic diagram illustrating the DAC operating in a calibration mode according to an embodiment of the present disclosure. In the calibration mode, the switches 313, 33, and 34 are turned off, and the switches 314 and 322 are turned on, thus allowing the second current outputted by output terminal 26 to pass through the transistor 311. Furthermore, by the fact that the control ends of both transistors 311 and 312 are with the same voltages and that the second ends of both transistors 311 and 312 are grounded, the currents passing through both transistors 311 and 312 are equal, which means that the current source circuit 31 serves as a current mirror in the calibration mode. On the other hand, since the currents passing through both transistors 311 and 312 are both the second current, the current deviation of the first current and the second current flows into the first input terminal of the comparison circuit 321. The current deviation results in an input voltage (point B in FIG. 2A) on the first input terminal of the comparison circuit 321, and this input voltage, which is the multiplication of the current deviation and the output impedance of point B, is compared with the reference voltage Vref to output a detection signal. For example, if the reference voltage Vref is 0.02V, the output voltage being greater than 0.02V would mean that there is a current deviation between the first current and the second current. In some embodiments, the comparison circuit 321 can be a current comparison circuit.

In some embodiments, the detection circuit 32 can be implemented by another analog-to-digital convertor. To be more specific, another analog-to-digital convertor can convert the voltage at point B into a digital signal (i.e., the detection signal), and output the digital signal to the control circuit 4, so as to determine if current deviation occurs between the first and the second currents. For instance, in the scenario that the digital output signal of another analog-to-digital convertor is a 4-bit signal, if the highest bit is logic 1, the control circuit 4 determines that the voltage at point B is greater than a reference voltage, and then further determines that there is a current deviation between the first and the second currents. In some embodiments, the detection circuit 32 of the switch circuit 3 can be implemented by, but not limited to, an analog-to-digital converter of a wireless/wired communication receiver, which means that the DAC 1 can share the analog-to-digital converter of the wireless/wired communication receiver.

Reference is made back to FIG. 1, in which the control circuit 4 is configured to, in the calibration mode, adjust the output current of the CDAC 23. To be more specific, the control circuit adjusts the output currents at the output terminal 25 and the output terminal 26 of the CDAC 23 according to the detection signal outputted by the detection circuit 32. The control circuit 4 includes a digital controller 41 and a storage circuit 42. The digital controller 41 couples to the output terminal of the detection circuit 32, the plurality of LDACs 21, the plurality MDACs 22, the plurality of CDACs 23 and the bias generator 24. The storage circuit 42 is configured to store relevant parameters for calibration. In some embodiments, the storage circuit 42 includes a mapping table to store relevant parameters corresponding to MDACs 22 respectively for calibration.

In some embodiments, the switches 313, 314, 322, 33 and 34 are controlled by the control circuit 4, which allows the DAC 1 to be switched between the calibration mode and the regular mode.

It should be noted that in the calibration mode, the digital controller 41 can adjust the current the CDAC 23 outputs at the output terminals 25 and 26 according to a control mechanism similar to one of a successive approximation register ADC (SAR ADC), further facilitating the matching of the first and second currents. In other words, the detection circuit 32, the digital controller 41 and the CDAC 23 can be seen as an SAR ADC, so as to make the voltage of the point B approximate to the voltage value of the reference voltage Vref.

Figure 3:
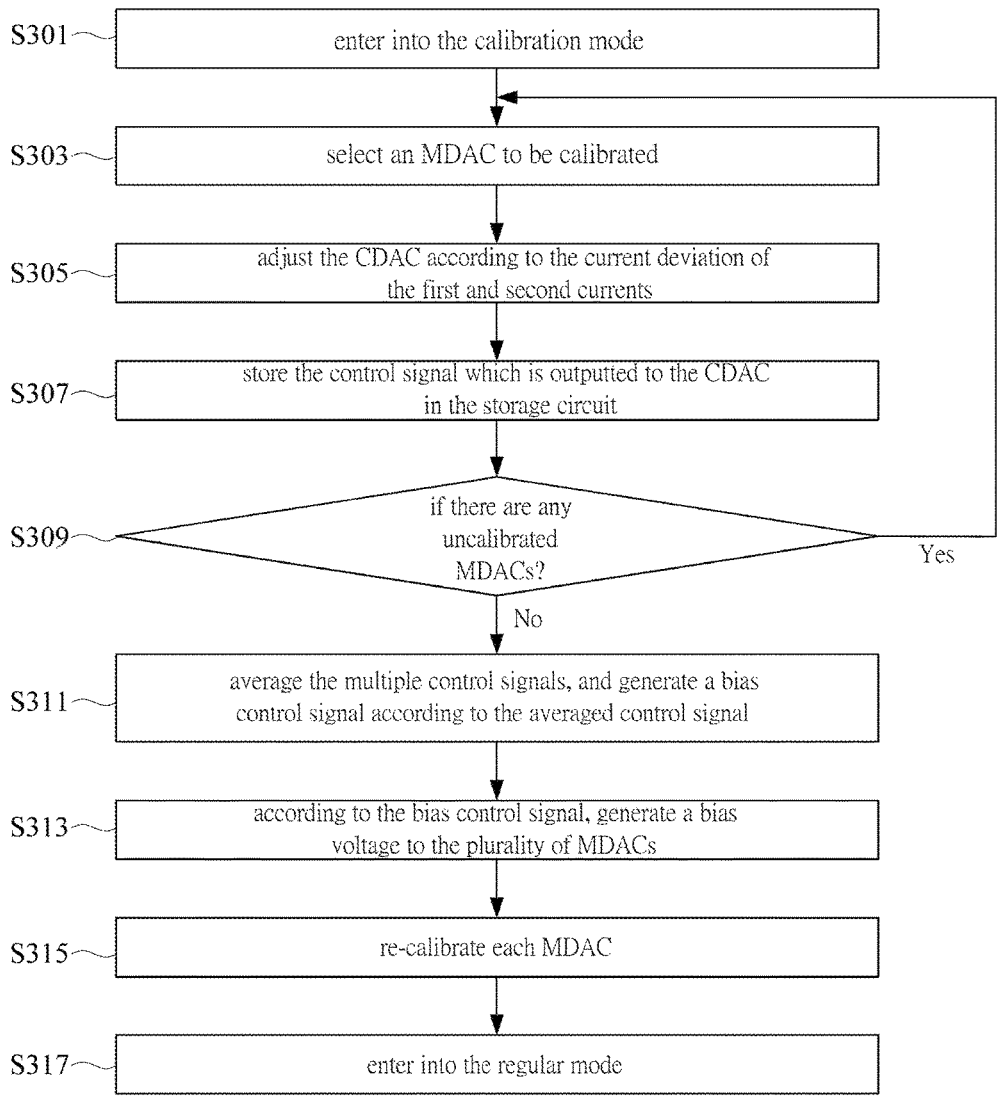
FIG. 3 is a flowchart showing the operation method for the DAC according to an embodiment of the present disclosure.

Reference is made to FIG. 3 to further describe the operations of the DAC. FIG. 3 is a flowchart showing the operation method 300 for the DAC according to an embodiment of the present disclosure. The DAC in FIG. 3 can be the DAC 1 as shown in FIG. 1, and the DAC 1 is taken for the purpose of illustration in the following description. The operation method includes steps S301 to S317.

In step S301, the DAC 1 enters into the calibration mode. In the calibration mode, the switches 314 and 322 are turned on, and the switches 313, 33 and 34 are turned off, as shown in FIG. 2A.

In step S303, the control circuit 4 selects an MDAC 22 to be calibrated. For instance, when entering into the calibration mode, the control circuit 4 selects the MDAC 22 corresponding to $MSB_0$.

In step S305, the digital controller 41 adjusts the output current which the CDAC 23 outputs at output terminals 25 and 26 according to the current deviation of the first and second currents, so as to obtain the control signal corresponding to the MDAC 22 to be calibrated. The digital controller 41 calibrates the MDAC 22 to be calibrated according to the operational logic of the SAR ADC.

In some embodiments, under the assumption that the DAC circuit 2 has fifteen MDACs 22, if the MDAC 22 to be calibrated corresponds to $MSB_0$, the digital controller 41 would first control the DAC circuit 2, such that the first current outputted by the output terminal 25 includes currents $I_{MSB0}$~$I_{MSB7}$, and that the second current outputted by the output terminal 26 includes currents $I_{MSB8}$~$I_{MSB14}$ and a current $I_{all\text{-}LSB}$. Currents $I_{MSB0}$~$I_{MSB14}$ are respectively outputted by the MDACs 22 corresponding to $I_{MSB0}$~$I_{MSB14}$, and the current $I_{all\text{-}LSB}$ is the sum of the currents outputted by multiple LDACs 21. In the meantime, the digital controller 41 finds an error of the current $I_{MSB0}$ (including a path error and a current error) according to the voltage of the point B and based on the operational logic of the SAR ADC, and further obtains the control signal corresponding to the MDAC 22 of the $MSB_0$. Moreover, in some embodiments, in order to accomplish better current matching, the digital controller 41 further controls the DAC circuit 2, such that the other first current outputted by the output terminal 25 includes the current $I_{all\text{-}LSB}$ and the currents $I_{MSB1}$~$I_{MSB7}$, and that the other second current outputted by the output terminal 26 includes the current $I_{MSB0}$ and currents $I_{MSB8}$~$I_{MSB14}$. In the meantime, the digital controller 41 finds another error of current $I_{MSB0}$ (including another path error and another current error) according to the voltage of point B and based on the operational logic of the SAR ADC, and further obtains the control signal the MDAC 22 corresponding to the $MSB_0$. The digital controller 41 then divides the difference between the two control signals by 2 to eliminate the path error, and to further obtain the control signal corresponding to the current error of the current $I_{MSB0}$.

In step S307, the digital controller 41 stores the control signal, which is outputted to the CDAC, in the storage circuit 42. The control signal corresponds to the current deviation of the MDAC 22 to be calibrated (e.g., the MDAC 22 corresponding to $MSB_0$). In some embodiments, the digital controller 41 may store the control signal which is outputted to the CDAC in the mapping table of the storage circuit 42.

In step S309, the digital controller 41 determines if there is any uncalibrated MDACs 22. In the affirmative, the operation method 300 goes back to step S303 to select the MDAC 22 (e.g., the MDAC 22 corresponding to $MSB_1$) to be calibrated; in the negative, the operation method 300 proceeds to step S311.

In step S311, the digital controller 41 averages the multiple control signals stored in the storage circuit 42, and generates a bias control signal to the bias generator 24 according to the averaged control signal.

In step S313, the bias generator 24 generates a bias voltage to the plurality of MDACs 22 according to the bias control signal, such that the plurality of MDACs 22 adjust the output current of the output terminals 25 and 26 according to the bias voltage.

It should be noted that, when the plurality of MDACs 22 receive the bias voltage, the sum of the current error of the output currents $I_{MSB0}$~$I_{MSB14}$ from the MDACs 22 is seen as 0, which further lowers the current adjusting range of the CDAC 23.

In step S315, the comparison circuit 312, the control circuit 4 and the CDAC 23 calibrate each MDAC 22 to obtain a plurality of the updated control signals, so as to store the updated control signals in the storage circuit 42. The updated control signals correspond to the plurality of MDACs 22, respectively.

In some embodiments, in step S315, the digital controller 41 does not need to recalibrate each MDAC 22. The digital controller 41 can obtain the updated control signals directly by subtracting the averaged control signal from the multiple control signals corresponding to the MDACs 22 respectively, and the digital controller 41 then stores the updated control signal in the storage circuit 42.

In step S317, the DAC 1 enters into the regular mode (as shown in FIG. 2B), and outputs an analog output signal according to a digital input signal and a plurality of updated control signals.

Reference is made to FIG. 2B, when the DAC 1 is operated in the regular mode, the switches 313, 33 and 34 are turned on, and the switches 314 and 322 are turned off, which makes the current source circuit 31 serve as a dual DC current source. That is to say, the current source circuit 31 provides direct current according to the bias voltage Vb. The control circuit 4 outputs signals to LDACs 21, MDACs 22 and CDACs 23 according to an external digital input signal (not shown in the figures) and the control signals (e.g., the updated control signals as shown in step S317) corresponding to MDACs 22. The control circuit 4 outputs the bias control voltage to the bias generator 24 to generate the bias voltage to the MDACs 22, and adjusts the output current of the CDACs 23 according to the external digital input signal and the control signals corresponding to MDACs 22, such that the current error of the MDACs 22 corresponding to each MSB can be eliminated.

In sum, the digital-to-analog converter and the operation method provided by the present disclosure do not only solve the mismatch problem in the conventional art, but also effectively reduce the cost on hardware and the time for calibration since the present disclosure utilizes the CDAC to find the bias voltage to which the current deviation corresponds according to the operational logic of the SAR ADC.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A digital-to-analog converter (DAC), configured to operate in a calibration mode and a regular mode, comprising:
   a DAC circuit having a first output terminal and a second output terminal, including:
      a plurality of most significant bit digital-to-analog converter (MDAC) circuits; and
      a plurality of calibration digital-to-analog converter (CDAC) circuits, wherein the plurality of MDAC circuits and the plurality of CDAC circuits are coupled to the first output terminal and the second output terminal;
   a switch circuit including:
      a current source circuit, coupled to the first output terminal and the second output terminal, configured to serve as a current mirror in the calibration mode to generate at least one current deviation of the first output terminal and the second output terminal, and configured to serve as a dual DC current source in the regular mode; and
      a detection circuit configured to detect the at least one current deviation in the calibration mode to generate at least one detection signal, the at least one detection signal corresponding to one of the plurality of MDAC circuits; and a control circuit configured to output at least one control signal to the plurality of CDAC circuits according to the at least one detection signal in the calibration mode, for adjusting output currents at the first output terminal and the second output terminal of the plurality of CDAC circuits.

2. The digital-to-analog converter according to claim 1, wherein the current source circuit comprises:
a first transistor, having a first end coupled to the second output terminal, a second end coupled to a ground, and a control end;
a second transistor, having a first end coupled to the first output terminal, a second end coupled to the ground, and a control end, wherein the control end of the first transistor is coupled to the control end of the second transistor;
a first switch, coupled between the control end of the first transistor and a first bias voltage; and
a second switch, coupled between the control end of the first transistor and the first end of the first transistor.

3. The digital-to-analog converter according to claim 2, wherein in the calibration mode, the first switch is turned off, the second switch is turned on, and the current source circuit serves as the current mirror to generate the current deviation of the first output terminal and the second output terminal, and in the regular mode, the first switch is turned on, the second switch is turned off, and the current source circuit serves as the dual DC current source to provide a current source according to the first bias voltage.

4. The digital-to-analog converter according to claim 2, wherein the detection circuit comprises:
a comparison circuit having a first input terminal and a second input terminal, wherein the second input terminal is configured to receive a reference voltage; and
a third switch, coupled between the first input terminal and the first output terminal, wherein the third switch is turned on in the calibration mode, and is turned off in the regular mode.

5. The digital-to-analog converter according to claim 1, wherein the detection circuit comprises:
a comparison circuit having a first input terminal and a second input terminal, wherein the first input terminal receives an input voltage from the first output terminal in the calibration mode, the second input terminal receives a reference voltage, and the comparison circuit is configured to compare the input voltage and the reference voltage to generate the detection signal, in which the input voltage corresponds to the current deviation.

6. The digital-to-analog converter according to claim 5, wherein the detection circuit further comprises:
a third switch, coupled between the first input terminal and the first output terminal, wherein the third switch is turned on in the calibration mode, and is turned off in the regular mode.

7. The digital-to-analog converter according to claim 1, wherein the detection circuit is an analog-to-digital circuit, the detection circuit is configured to receive an input voltage through the first output terminal and convert the input voltage to the detection signal, in which the input voltage corresponds to the current deviation.

8. The digital-to-analog converter according to claim 1, wherein the control circuit further comprises a storage circuit, and if a first detection signal of the at least one detection signal corresponding to the current deviation is smaller than a threshold value, the control circuit stores a first control signal corresponding to the first detection signal in the storage circuit, in which the first control signal is one of the at least one control signal.

9. The digital-to-analog converter according to claim 8, wherein the DAC circuit further comprises:
a bias voltage generator, configured to generate a bias voltage to the plurality of MDAC circuits according to a bias voltage control signal, wherein the control circuit generates the bias voltage control signal according to the first control signal corresponding to each of the MDAC circuits.

10. The digital-to-analog converter according to claim 9, wherein the control circuit is configured to average the first control signal corresponding to each of the MDAC circuits to generate a second control signal, wherein the control circuit generates the bias voltage control signal according to the second control signal.

11. An operation method applied to a digital-to-analog converter (DAC), wherein the DAC comprises a DAC circuit having a first output terminal, a second output terminal, a plurality of most significant bit digital-to-analog converter (MDAC) circuits, and a plurality of calibration digital-to-analog converter (CDAC) circuits, and the operation method comprises:
entering into a calibration mode;
calibrating each of the plurality of MDAC circuits to obtain a first control signal corresponding to each of the MDAC circuits, wherein the first control signal controls the plurality of CDAC circuits;
generating a second control signal according to the first control signal corresponding to each of the MDAC circuits;
generating a bias voltage to the plurality of MDAC circuits according to the second control signal; and
calibrating each of the MDAC circuits receiving the bias voltage to obtain a third control signal corresponding to each of the MDAC circuits, wherein the third control signal controls the plurality of CDAC circuits.

12. The operation method according to claim 11, further comprising
entering into a regular mode;
receiving a digital input signal; and
converting the digital input signal into an analog output signal according to the bias voltage and the third control signal corresponding to each of the MDAC circuits.

13. The operation method according to claim 11, wherein the DAC circuit further comprises a bias voltage generator, and the step of generating the bias voltage according to the second control signal further comprises:
generating a bias voltage control signal according to the second control signal, wherein the bias voltage control signal controls the bias voltage generator to generate the bias voltage.

14. The operation method according to claim 11, wherein the step of calibrating each of the plurality of MDAC circuits to obtain the first control signal corresponding to each of the MDAC circuits further comprises:
selecting one MDAC circuit from the plurality of MDAC circuits;
generating at least one control signal to the plurality of CDAC circuits according to a current deviation of the first output terminal and the second output terminal, for adjusting output currents at the first output terminal and the second output terminal of the plurality of CDAC circuits;
selecting one control signal from the at least one control signal as the first control signal, wherein the current deviation corresponding to the first control signal is smaller than a threshold value.

15. The operation method according to claim 11, wherein the step of generating the second control signal according to the first control signal corresponding to each of the MDAC circuits further comprises:
   averaging the first control signal corresponding to each of the MDAC circuits to generate the second control signal.

16. The operation method according to claim 15, wherein the step of calibrating each of the MDAC circuits receiving the bias voltage further comprises:
   subtracting the second control signal from the first control signal of each of the MDAC circuits to obtain the third control signal corresponding to each of the MDAC circuits.

17. The operation method according to claim 11, wherein the step of calibrating each of the MDAC circuits receiving the bias voltage further includes:
   selecting one MDAC circuit from the plurality of MDAC circuits;
   generating at least one control signal to the plurality of CDAC circuits according to a current deviation of the first output terminal and the second output terminal, for adjusting output currents at the first output terminal and the second output terminal of the plurality of CDAC circuits;
   selecting one control signal from the at least one control signal as the third control signal, wherein the current deviation corresponding to the third control signal is smaller than a threshold value.

* * * * *